United States Patent
Prokopenko et al.

(10) Patent No.: US 7,159,003 B1
(45) Date of Patent: Jan. 2, 2007

(54) METHOD AND APPARATUS FOR GENERATING SIGN-DIGIT FORMAT OF SUM OF TWO NUMBERS

(75) Inventors: Boris Prokopenko, Campbell, CA (US); Timour Paltashev, Fremont, CA (US); Derek Gladding, San Francisco, CA (US)

(73) Assignee: S3 Graphics Co., Ltd. (KN)

( * ) Notice: Subject to any disclaimer, the term of this patent is extended or adjusted under 35 U.S.C. 154(b) by 613 days.

(21) Appl. No.: 10/371,272

(22) Filed: Feb. 21, 2003

(51) Int. Cl.
*G06F 7/50* (2006.01)
(52) U.S. Cl. ................................... 708/706
(58) Field of Classification Search ............... 708/706, 708/708, 523
See application file for complete search history.

(56) References Cited

U.S. PATENT DOCUMENTS 5,113,363 A * 5/1992 Orsino et al. ............... 708/523
6,754,689 B1 * 6/2004 Bhushan et al. ............ 708/670
2001/0016865 A1 * 8/2001 Goto ......................... 708/708

* cited by examiner

Primary Examiner—D. H. Malzahn
(74) Attorney, Agent, or Firm—Anthony B. Diepenbrock, III; Dechert LLP

(57) ABSTRACT

A system and method for converting two binary digits into redundant sign-digit format. The system comprises a first adder for adding the binary digits together to generate a first result. A second adder adds an input carry from a previous digit to the first result and subtracts a value equal to the radix of the of the binary digits form the first result if the first result is greater than an initial threshold in order to generate an intermediate result. The system further includes a third adder for adding a second input carry from the previous digit to the intermediate result and subtracting the value of the radix from the intermediate result if the intermediate result is greater than a prescribed value such that the addition of the two binary digits are in redundant sign-digit format.

19 Claims, 4 Drawing Sheets

METHOD AND APPARATUS FOR GENERATING SIGN-DIGIT FORMAT OF SUM OF TWO NUMBERS

FIELD OF THE INVENTION

The present invention generally relates to the computation of binary numbers, and more particularly to the efficient conversion of binary numbers into sign-digit redundant form.

DESCRIPTION OF THE RELATED ART

In order to build compact binary multipliers, the sign-digit representation of a binary number is used in the hardware design. If a digit of the binary number is made wider, then the total number of digits is reduced. Accordingly, certain radix digits are chosen for the desired numbering system. The most popular system uses sign-digit numbers with radix 4. Accordingly, each two bits of a number are substituted by a digit which has a value from the set of {−2, −1, 0, 1, 2}. An advantage of this radix system is that a partial product generated by multiplying the digit by a second argument involves only simple logic operations to produce. For instance, the partial product may be generated by masking, shifting by one and inversion. Accordingly, instead of generating n partial products for a n-bit binary number, only n/2+2 partial products are generated.

After all the partial products have been generated during multiplication, then the partial products are added together using the well-known Wallace Tree. The Wallace Tree reduces the number of partial products at each stage without full carry propagation. The Wallace Tree functions as a "carry-save" adder (CSA) and does not make use of full carry propagation. The output of the CSA is a carry save-number which contains the partial sum of the number and all of the carries. In order to compute the final value, a carry propagation adder (CPA) is used to add the carries. Typically, the CPA has a larger delay by comparison to the CSA.

Referring to FIG. 1, the delays with the addition and multiplication of three values A, B, and C is shown. The desired result is (A+B)·C wherein A, B, and C are binary numbers. Both the values A and B are inputted into adder CPA 10 that is a carry propagation adder which has a large delay associated therewith. Once the values A and B have been added by the CPA 10, the sum of A+B is fed into a multiplier Wallace Tree 14. The value C is fed into a booth encoder 12 which can encode the value C for multiplication using the well-known Booth's algorithm. The encoded value of C from the booth encoder 12 is then fed into the multiplier 14 which computes the value (A+B)·C with a final CPA 11. As previously mentioned, the delay of the CPA 10 and the final CPA 11 is significantly large compared to the multiplier Wallace Tree 14 such that the arrangement of FIG. 1 has a large latency caused by using two CPAs with appropriate delays.

FIG. 2 shows the same operation as FIG. 1, but carried out in a different manner. Specifically, the values of A and B are fed into respective multiplier Wallace Trees 14a and 14b. The value C is also fed into each of the multipliers 14a and 14b after being booth encoded in encoder 12. In this respect, multiplier 14a computes the value of A·C and multiplier 14b computes the value of B·C. The outputs of the multipliers 14a and 14b are fed into adder 16 which adds the values together to achieve the final result A·C+B·C (i.e., (A+B)·C). As is evident from FIG. 2, this method of computation reduces the delay from the CPA 10, but increases the complexity and gate count of the circuit by including two multipliers 14a and 14b.

The present invention addresses the above-mentioned deficiencies in computation of binary numbers by providing a system and method that reduces circuit complexity and latency in the computation. Specifically, the present invention provides a method whereby the gate count for the computational circuit is reduced compared to the circuit of FIG. 2, yet the speed of the computation is not decreased by providing an efficient conversion of the binary numbers into sign-redundant form. Accordingly, the present invention provides a good balance between complexity and latency in order to achieve a small, and simple device.

BRIEF SUMMARY OF THE INVENTION

In accordance with the present invention, there is provided a method for partial adding and converting two numbers having binary digits into a redundant sign-digit format. The method uses partial propagation of the carry of the sum regarding the desired radix of the Booth encoder. The radix is used as a bias for interim results. The binary digits of each number are added together with a first adder in order to generate a first result with a first carry. A second adder adds the first result to a first input carry of a previous digit. A value equal to the radix of the binary digits is subtracted from the first result with the second addition block if the first result is greater than an initial threshold such that an intermediate result and a second carry is generated. A third adder adds the intermediate result to a second input carry of the previous digit. With the third adder, the value of the radix is subtracted from the intermediate result if the intermediate result is greater than a prescribed value in order to generate a final output in redundant sign-digit format. The method is continued for all sets of binary digits.

In accordance with the present invention, there is also provided a system for multiplying the sum of a first number A and a second number B by a third number C. The system has a first adder configured to add the binary digits of A and B together and generate a first result with a first carry. The system also includes a second adder block configured to add the first result to the first input carry of a previous digit. Furthermore, the second adder is configured to subtract the value of the radix from the first result if the first result is greater than an initial threshold in order to generate an intermediate result with a second carry. The system includes a third adder configured to add the intermediate result to a second input carry of a previous digit and subtract the value of the radix from the intermediate result if the intermediate result is greater than a prescribed value. In this regard, the first, second, and third adders are configured to add and convert the numbers A and B into sign-digit redundant format. The system further includes a multiplier configured to multiply the redundant sign-digit format of the addition of A and B from the third adder by the value of C in order to generate the final result.

In addition to the foregoing, there is provided a method for multiplying the sum of a first number A having binary digits and a second number B having binary digits by a third number C. The binary digits of A and B are added together in order to generate the first result with the first carry. The first result is added to the first input carry of the previous digit. Then, the value of the radix is subtracted from the first result if the first result is greater than an initial threshold in order to generate the intermediate result with the second carry. The intermediate result is added to the second input carry of the previous digit and the radix is subtracted from the intermediate result if the intermediate result is greater than a prescribed value. This result is the sum of A and B expressed in sign-digit redundant format. Then, the sign-digit redundant format of the sum of A and B is multiplied with C in order to generate the final result.

BRIEF DESCRIPTION OF THE DRAWINGS

These, as well as other features of the present invention, will become more apparent upon reference to the drawings wherein.

DETAILED DESCRIPTION OF THE INVENTION

Figure 1:
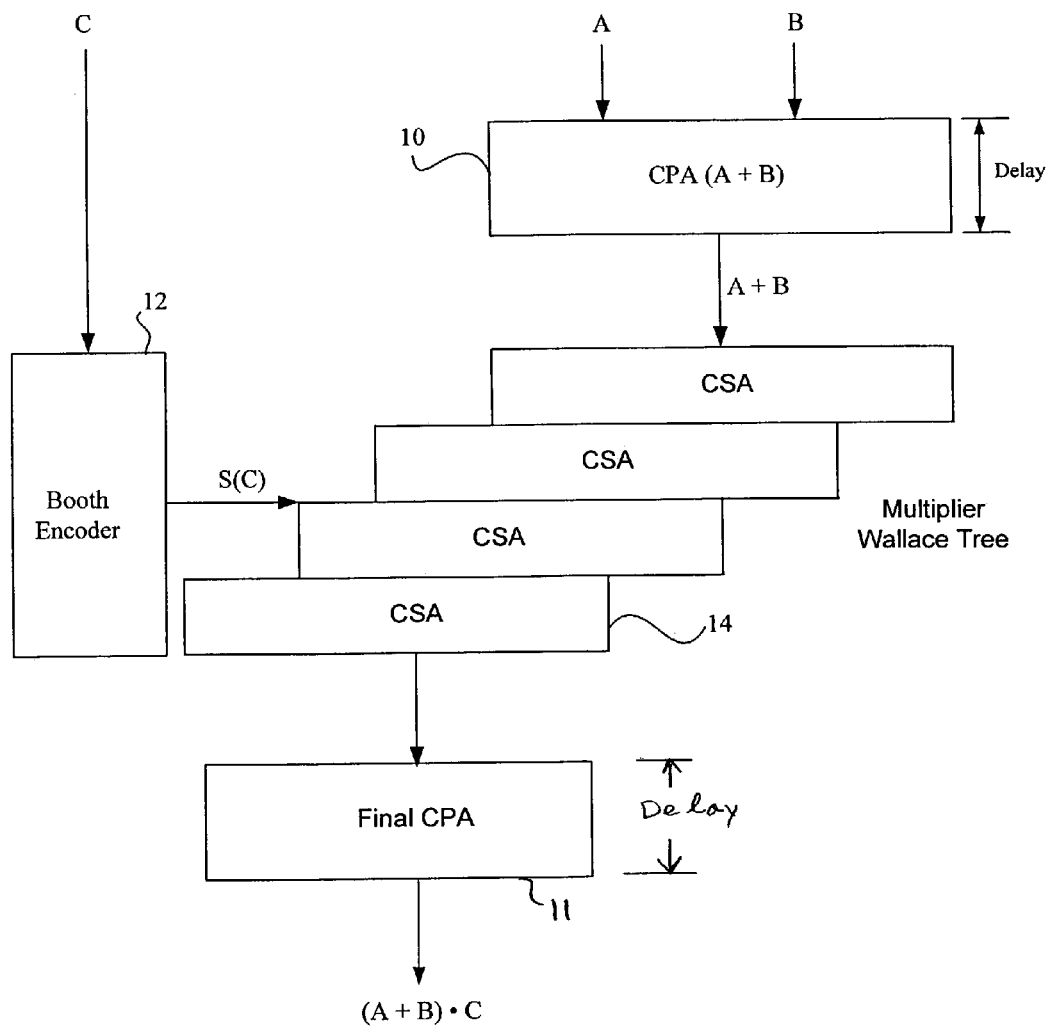
FIGS. 1 and 2 are prior art computational circuits.
Figure 2:
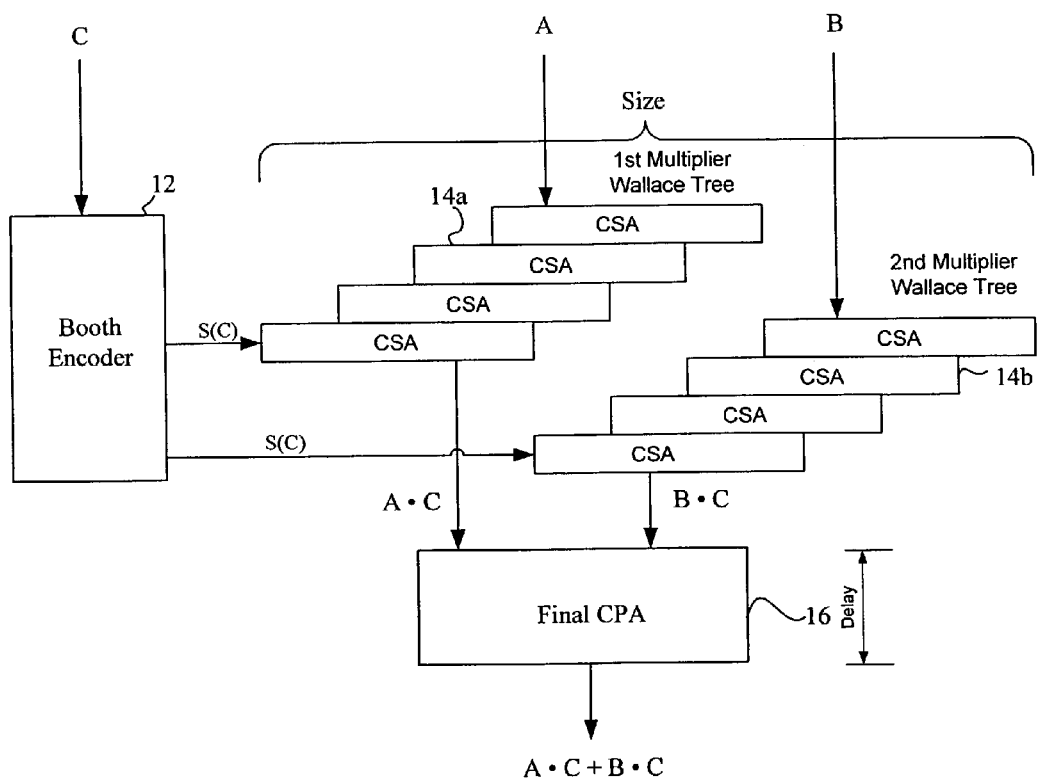
Figure 3:
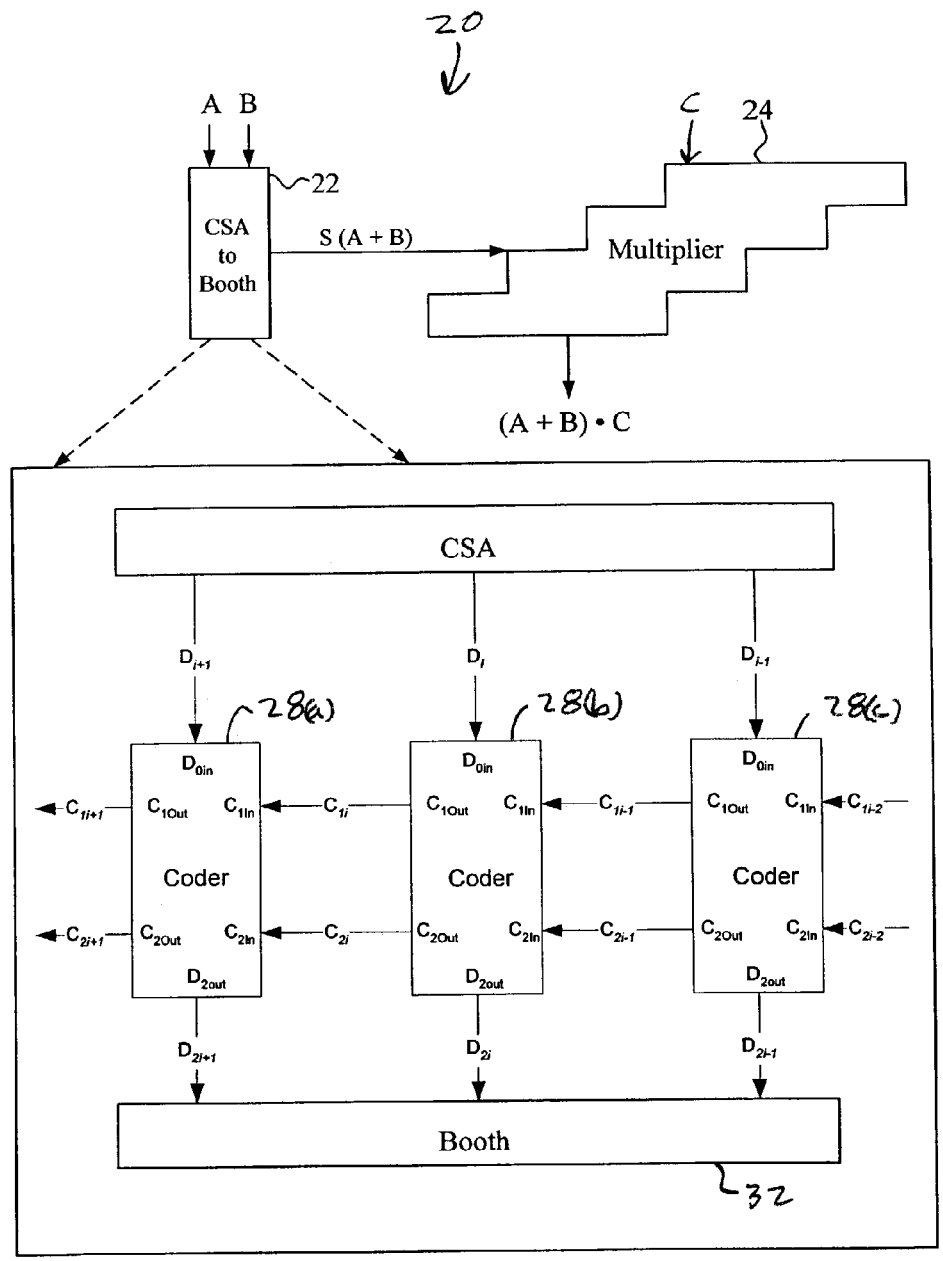
FIG. 3 is a conversion circuit constructed in accordance with the present invention.

Referring now to the drawings wherein the showings are for purposes of illustrating a preferred embodiment of the present invention only, and not for purposes of limiting the same, FIG. 3 illustrates a computational circuit 20 constructed in accordance with the preferred embodiment of the present invention and used to compute the value (A+B)·C. The circuit 20 has a CSA to Booth encoder 22 which encodes the value of A+B, as will be further explained below. The value of A+B is fed into a multiplier 24 which also receives the value of C. The multiplier 24 multiplies A+B by C to output the final result of: (A+B)·C.

Figure 4:
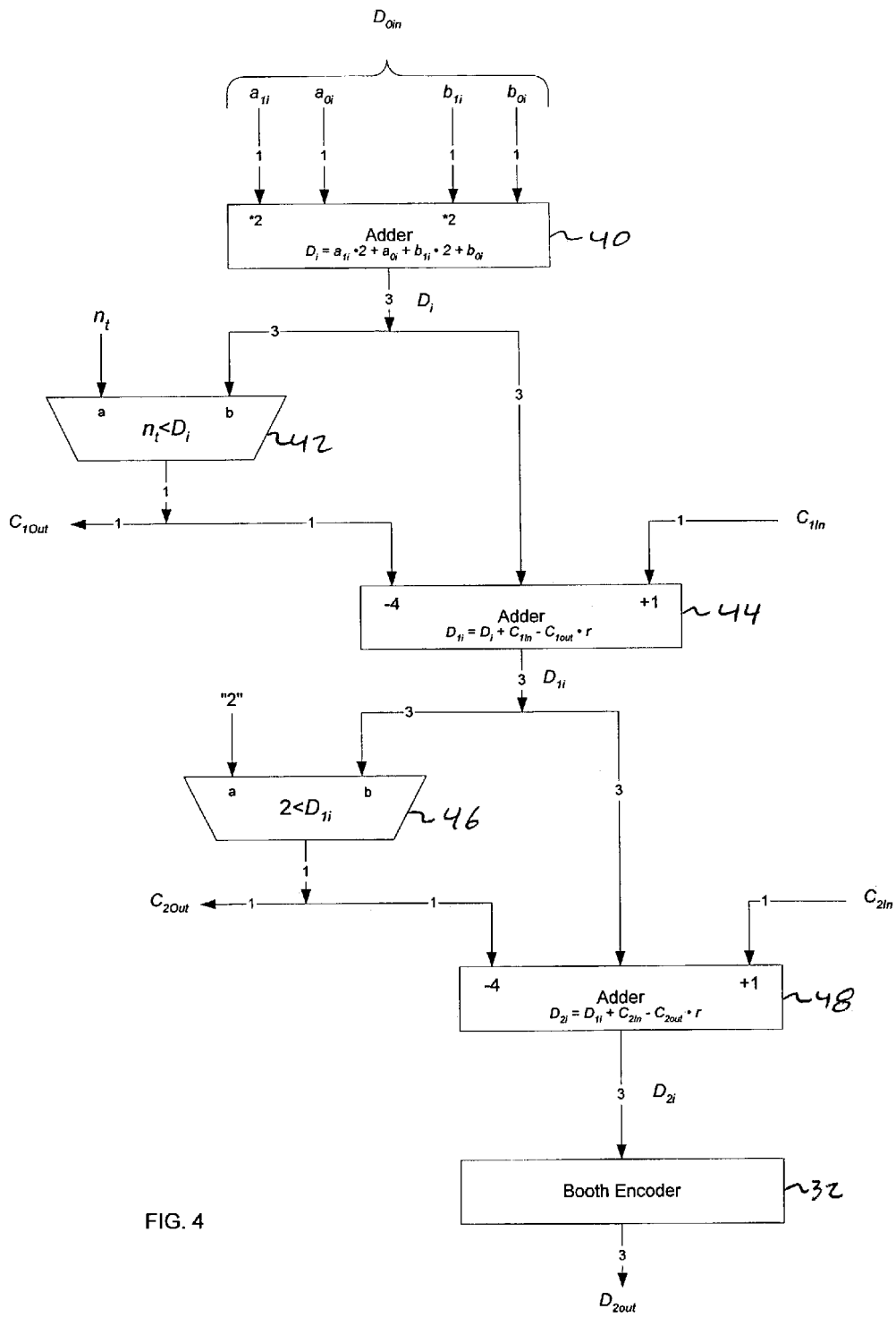
FIG. 4 is a basic conversion circuit for radix 4 sign-digits.

The CSA to booth encoder 22 provides a novel manner to convert the sum of A and B into sign-digit redundant form for multiplication by C in multiplier 24. FIG. 4 illustrates the structure of each coder unit 28 replicated for each digit position shown in FIG. 3. Specifically, A and B are 2 digit binary CSA numbers such that a first result $D_i$ is generated with an adder 40 by:

$$D_i = a_{1i} \cdot 2 + a_{0i} + b_{1i} \cdot 2 + b_{0i} \Rightarrow D_i \epsilon \{0 \ldots 6\} \quad (1)$$

wherein $a_{1i}$, $a_{0i}$, and $b_{1i}$, $b_{0i}$ are the respective two bit binary digit representations for A and B on the digit position i.

Next, a threshold value $n_t$ is declared to be:

$$n_t: n_t \epsilon \{2 \ldots 5\} \quad (2)$$

Accordingly, then the output carry signal $C_{1out}$ is determined with comparator 42 to be:

$$C_{1out} = \begin{cases} 0, D_i < n_t \\ 1, D_i \geq n_t \end{cases} \quad (3)$$

After adding the input carry from the previous digit $C_{1in}$ with adder 44, the value of an intermediate result D1i is:

$$D_{1i} = D_i + C_{1in} - C_{1out} \cdot r \Rightarrow \quad (4)$$

$$D_{1i} \epsilon \{min(n_t-4,0) \ldots (n_t, 2)\} \quad (5)$$

Wherein the bias r=4 is the radix of the binary system used.

At this stage the output carry $C_{2out}$ can be declared to be with comparator 46:

$$C_{2out} = \begin{cases} 0, D_{1i} < \frac{r}{2} \\ 1, D_{1i} \geq \frac{r}{2} \end{cases} \quad (6)$$

The value of the final digits converted into redundant sign-digit format $D_{2i}$ after adding the input carry from the previous digit $C_{2in}$ with adder 48 becomes:

$$D_{2i} = D_{1i} + C_{2in} - C_{2out} \cdot r \Rightarrow D_{2i} \epsilon \{-2,-1,0,1,2\} \quad (7)$$

wherein the bias r=4 is the radix of the binary system used.

As will be recognized, $D_{2i}$ is in sign digit format because it is an element of the set $\{-2, -1, 0, 1, 2\}$. This is the digit representation that reduces multiplication steps in the multiplier 24.

Referring back to FIG. 3, each coder 28 computes the equations (1)–(7) described above and shown in FIG. 4 for calculating the final result. Each coder 28 generates a respective $D_{2i}$. As previously mentioned, the final results are in sign-redundant form that facilitate multiplication with the value C.

TABLE 1

| | | | | | |
|---|---|---|---|---|---|
| a = | 10 | 10 | 00 | 10 | 162 |
| b = | 10 | 10 | 10 | 11 | +1 71 |
| | | | | | = 333 |
| $D_o$ | 4 | 4 | 2 | 5 | |
| $C_{1out/in}$ | 1 | 1 | 0 | 1 | |
| $D_1$ 1 | 1 | 0 | 3 | 1 | |
| $C_{2out/in}$ 0 | 0 | 0 | 1 | 0 | |
| $D_2$ 1 | 1 | 1 | -1 | 1 | = 333 |

Referring to Table 1, an example showing the conversion of two binary numbers into sign-digit redundant format is shown. In this example, the threshold value n, is selected to be $n_t=4$. Table 1 shows the resultant values of D and C using the method of the present invention. As can be seen, the method converts the two binary numbers into sign-digit redundant form while adding their values together to achieve the result: $D_2=111-11=333$. As previously discussed, the resultant values can then be multiplied by multiplier 24 with the value of C to achieve the final result.

More specifically, Table 1 describes the situation wherein:

$$a=162=(10100010)_2 \quad (8)$$

$$b=171=(10101011)_2 \quad (9)$$

$$a+b=162+171=(10100010)_2+(10101011)_2=333 \quad (10)$$

For a = 162 (11)

$$= (1010010)_2 \quad (12)$$

$$= (10\ 10\ 00\ 10)_2 \quad (13)$$

$$= (10)_2 \cdot 4^3 + (10)_2 \cdot 4^2 + (00)_2 \cdot 4^1 + (10)_2 \cdot 4^0 \quad (14)$$

$$\equiv \sum_{j=0}^{3} Aj \cdot 4^j \quad (15)$$

wherein, $A_3=(10)_2$, $A_2=(00)_2$, $A_1=(10)_2$ and $A_0=(10)_2$ (16)

Further define $A_j$:

$$A_j = (a_{1j} \cdot 2^1 + a_{0j} \cdot 2^0) = (a_{1j} \cdot 2 + a_{0j}) \quad (17)$$

Because $A_3 = (10)_2$, then $a_{13} = 1$ and $a_{03} = 0$. Similarly:

$a_{12} = 1, a_{02} = 0$ (18)

$a_{11} = 0, a_{01} = 0$ (19)

$a_{10} = 1, a_{00} = 0$ (20)

For $b = 171$
$= (10101011)_2$
$= (10\ 10\ 10\ 11)_2$
$= (10)_2 \cdot 4^3 + (10)_2 \cdot 4^2 + (10)_2 \cdot 4^1 + (11)_2 \cdot 4^0$
$\equiv \sum_{j=0}^{3} B_j \cdot 4^j$ wherein, $B_3 = (10)_2$, $B_2 = (10)_2$, $B_1 = (10)_2$, $B_0 = (11)_2$,
Further define $B_j$:

$$B_j = (b_{1j} \cdot 2^1 + b_{0j} \cdot 2^0) = (b_{1j} \cdot 2 + b_{0j}) \quad (27)$$

Accordingly:

$b_{13} = 1, b_{03} = 0$ (28)

$b_{12} = 1, b_{02} = 0$ (29)

$b_{11} = 1, b_{01} = 0$ (30)

$b_{10} = 1, b_{00} = 1$ (31)

And thus:

$$a + b = \sum_{j=0}^{3} A_j \cdot 4^j + \sum_{j=0}^{3} B_j \cdot 4^j \quad (32)$$

$$= \sum_{j=0}^{3} (A_j + B_j) \cdot 4^j \quad (33)$$

$$= \sum (a_{1j} \cdot 2 + a_{0j} + b_{1j} \cdot 2 b_{0j}) \cdot 4^j \quad (34)$$

According to Eq. (1):

$D_{0i} = (a_{1i} \cdot 2 + a_{0i}) + (b_{1i} \cdot 2 + b_{0i})$ (35)

$\Rightarrow D_{0i} = (A_j + B_j)$; and (36)

$\Rightarrow D_{03} = (1 \cdot 2 + 0) + (1 \cdot 2 + 0) = 4$ (37)

$\Rightarrow D_{02} = (1 \cdot 2 + 0) + (1 \cdot 2 + 0) = 4$ (38)

$\Rightarrow D_{01} = (0 \cdot 2 + 0) + (1 \cdot 2 + 0) = 2$ (39)

$\Rightarrow D_{00} = (1 \cdot 2 + 0) + (1 \cdot 2 + 1) = 5$ (40)

As stated previously, in equation (3), $C_{1i} = 1$ if $D_{0i} \geq n_t$, otherwise $C_{1i} = 0$ if $D_{0i} < n_t$ where $n_t \epsilon \{2 \ldots 5\}$. In this example, $n_t = 4$. Accordingly:

$\Rightarrow C_{13} = 1$ (41)

$\Rightarrow C_{12} = 1$ (42)

$\Rightarrow C_{11} = 0$ (43)

$\Rightarrow C_{10} = 1$ (44)

Therefore:

$$D_{1i} = (a_{1i} \cdot 2 + a_{0i}) + (b_{1i} \cdot 2 + b_{0i}) + C_{1i-1} - C_{1i} \cdot r \quad (45)$$

$$= D_{0i} + C_{1i-1} - C_{1i} \cdot r = C_{0i} + (C_{1i-1} - C_{1i} \cdot r) \quad (46)$$

Accordingly:

$\Rightarrow D_{14} = D_{04} + (C_{13} - C_{14} \cdot 4) = 0 + 1 - 0 \cdot 4 = 1$ (47)

$\Rightarrow D_{13} = D_{03} + (C_{12} - C_{13} \cdot 4) = 4 + 1 - 1 \cdot 4 = 1$ (48)

$\Rightarrow D_{12} = D_{02} + (C_{11} - C_{12} \cdot 4) = 4 + 0 - 1 \cdot 4 = 0$ (49)

$\Rightarrow D_{11} = D_{01} + (C_{10} - C_{11} \cdot 4) = 2 + 1 - 0 \cdot 4 = 3$ (50)

$\Rightarrow D_{10} = D_{00} + (0 - C_{10} \cdot 4) = 5 + 0 - 1 \cdot 4 = 1$ (51)

As previously described, $C_{21} = 1$ if $D_{1i} \geq 2$, otherwise $C_{2i} = 0$ such that:

$\Rightarrow C_{24} = 0$ (52)

$\Rightarrow C_{23} = 0$ (53)

$\Rightarrow C_{22} = 0$ (54)

$\Rightarrow C_{21} = 1$ (55)

$\Rightarrow C_{20} = 0$ (56)

Therefore:

$$D_{2i} = D_{1i} + C_{2i-1} - C_{2i} \cdot r \quad (57)$$

Accordingly:

$\Rightarrow D_{24} = D_{14} + (C_{23} - C_{24} \cdot 4) = 1 + 0 - 0 \cdot 4 = 1$ (58)

$\Rightarrow D_{23} = D_{13} + (C_{22} - C_{23} \cdot 4) = 1 + 0 - 0 \cdot 4 = 1$ (59)

$\Rightarrow D_{22} = D_{12} + (C_{21} - C_{22} \cdot 4) = 0 + 1 - 0 \cdot 4 = 1$ (60)

$\Rightarrow D_{21} = D_{11} + (C_{20} - C_{21} \cdot 4) = 3 + 0 - 1 \cdot 4 = -1$ (61)

$\Rightarrow D_{20} = D_{10} + (0 - C_{20} \cdot 4) = 1 + 0 - 0 \cdot 4 = 1$ (62)

Therefore, arranging this information into Table 2:

TABLE 2

| Base: r = 4 (i.e., bias). | i = 4 | i = 3 | i = 2 | i = 1 | i = 0 | |
|---|---|---|---|---|---|---|
| $A_i = a_{1i}a_{0i}$ | | $a_{13}a_{03} = 10$ | $a_{12}a_{02} = 10$ | $a_{11}a_{01} = 00$ | $a_{10}a_{00} = 10$ | $(162)_{10}$ |
| $B_i = b_{1i}b_{0i}$ | | $b_{13}b_{03} = 10$ | $b_{12}b_{02} = 10$ | $b_{11}b_{01} = 10$ | $b_{10}b_{00} = 11$ | $(171)_{10}$ |
| A + B | | | | | | $= (333)_{10}$ |
| $D_{0i} = (a_{1i} \cdot 2 + a_{0i}) + (b_{1i} \cdot 2 + b_{0i})$ | | $D_{03} = 4$ | $D_{02} = 4$ | $D_{01} = 2$ | $D_{00} = 5$ | |
| $C_{1i} = 1$ if $D_{0i} \geq n_t$ Else, $C_{1i} = 0$ | | $C_{13} = 1$ | $C_{12} = 1$ | $C_{11} = 0$ | $C_{10} = 1$ | |
| $D_{1i} = D_{0i} + C_{1i-1} -$ | $D_{14} = 1$ | $D_{13} = 1$ | $D_{12} = 0$ | $D_{11} = 3$ | $D_{10} = 1$ | |

TABLE 2-continued

| Base: r = 4 (i.e., bias). | i = 4 | i = 3 | i = 2 | i = 1 | i = 0 | |
|---|---|---|---|---|---|---|
| $C_{1i} \cdot r$ | | | | | | |
| $C_{2i} = 1$ if $D_{1i} \geq 2$ Else, $C_{2i} = 0$ | $C_{24} = 0$ | $C_{23} = 0$ | $C_{22} = 0$ | $C_{21} = 1$ | $C_{20} = 0$ | |
| $D_{2i} = D_{1i} + C_{2i-1} - C_{2i} \cdot r$ | $D_{24} = 1$ | $D_{23} = 1$ | $D_{22} = 1$ | $D_{21} = -1$ | $D_{20} = 1$ | $= (333)_{10}$ |

The previous example show the multiplication of binary numbers in radix 4, however it is possible to compute numbers in other radixes such as radix 8 and 16, etc. . . . . Additionally, the bias r for $D_{1i}$ and $D_{2i}$ depends on the radix chosen. Specifically, in the examples for equations (4) and (7) the bias r is chosen as 4 as the radix of the number system used. However, r would be 8 or 16 for number systems with radixes 8 or 16 respectively. Furthermore, in order to further optimize the system, the value of $n_t$ may be varied. By changing the value threshold value of propagation $n_t$ at the first stage of propagation, it is possible to optimize the hardware of the system.

The following equations illustrate the general case for computing the output result $D_{2i}$. If there is an N-bit digit of a binary CSA number such as N>1, then:

$$D_i = \sum_{j=0}^{N-1} 2^j(a_{j_i} + b_{j_i}) \Rightarrow D_i \in \{0 \ldots 2^{N+1} - 2\} \quad (63)$$

For this N-bit digit the radix r is $2^N$. A threshold value $n_t$ is declared to be:

$$n_t : n_t \in \left\{\frac{1}{2}r \ldots \frac{3}{2}r - 1\right\} \quad (64)$$

Then the output carry signal is:

$$C_{1i} = \begin{cases} 0, D_i < n_t \\ 1, D_i \geq n_t \end{cases} \quad (65)$$

After reading the input carry from the previous digit $C_{1i-1}$, the value of $D_{1i}$ is:

$$D_{1i} = D_i s + C_i - C_{1i} r$$

$$D_{1i} \in \{n_{low} \ldots n_{high}\}$$

Where:

$$n_{low} = \min(n_t - r, 0) \in \left\{-\frac{1}{2}r \ldots 0\right\} \quad (68)$$

$$n_{high} = \max\left(\frac{1}{2}r, n_t\right) \in \left\{\frac{1}{2}r \ldots \frac{3}{2}r - 1\right\} \quad (69)$$

Accordingly, the lower boundary $n_{low}$ cannot exceed the desired range even considering any possible carry. The upper boundary $n_{high}$ is chosen to fit the digit into the desired range after the second carry. The threshold value range $n_t$ is actually determined by both boundaries such that:

$$\exists m \in \left\{\frac{1}{2}r \ldots \frac{3}{2}r - 1\right\} \wedge c \in 0 \ldots 1 \Rightarrow \quad (70)$$

$$m - r + c \in \left\{-\frac{1}{2}r \ldots \frac{1}{2}r\right\} \quad (71)$$

The output carry at this second stage is declared to be:

$$C_{2i} = \begin{cases} 0, D_{1i} < \frac{1}{2}r \\ 1, D_{1i} \geq \frac{1}{2}r \end{cases} \quad (72)$$

After adding the input carry from the previous digit $C_{2i-1}$, the value of the output $D_{2i}$ becomes:

$$D_{2i} = D_{1i} + C_{2i-1} - C_{2i} \cdot r \Rightarrow D_{2i} \in \left\{-\frac{1}{2}r \ldots \frac{1}{2}r\right\} \quad (73)$$

which is in the sign-digit representation for radix $2^N$.

Additional modifications and improvements of the present invention may also be apparent to those of ordinary skill in the art. Thus, the particular combination of parts described and illustrated herein is intended to represent only a certain embodiment of the present invention, and is not intended to serve as a limitation of alternative devices within the spirit and scope of the invention.

What is claimed is:

1. A method for adding respective digits of two numbers, each digit having a plurality of bits, so that the sum has a redundant sign-digit format, the method comprising:
   determining an initial threshold;
   adding with a first adder the bits of each digit to generate a first result;
   comparing the first result with the initial threshold to determine whether or not the first result has a first carry;
   adding with a second adder the first result to an input first carry of a previous digit and subtracting with the second adder a value equal to the radix of the digit from the first result if the first result has a first carry in order to generate an intermediate result;
   comparing the intermediate result with a prescribed value to determine whether or not the intermediate result has a second carry; and
   adding with a third adder the intermediate result to an input second carry of a previous digit and subtracting with the third adder the value equal to the radix of the digit from the intermediate result if the intermediate result has a second carry.

2. The method of claim 1, wherein each digit has two bits.

3. The method of claim 1, wherein the initial threshold is chosen between the values of 2 and 5; and
wherein the prescribed value is 2.

4. The method of claim 1 further comprising repeating each step for each digit of the two numbers.

5. The method of claim 1
wherein each digit of the two numbers has N bits; and
wherein adding with a first adder includes adding with the first adder each of the respective N bits from each digit together to generate an (N+1) bit result;
wherein adding with the second adder includes adding with the second adder each of the (N+1) bit result to a carry in of a previous digit and subtracting with the second adder the value of the radix of the digit from the N+1-bit result if the N+1 bit result is greater than an initial threshold in order to generate an intermediate N+1 bit result; and
wherein adding with the third adder includes adding with the third adder each of the N+1 bit intermediate result to a carry in from the previous digit and subtracting with the third adder the value of the radix of the digit from each of the N+1 bit intermediate result if the N+1 bit intermediate result is greater than the prescribed value.

6. A system for adding respective digits of two numbers, each digit having a plurality of bits, so that the sum has a redundant sign-digit format, the system comprising:
a first adder configured to add the bits of each digit to generate a first result;
a first comparator operative to compare the first result with an initial threshold to determine whether or not the first result has a first carry;
a second adder configured to add the first result to an input first carry of a previous digit and to subtract a value equal to the radix of the digits from the first result if the first result has a first carry in order to generate an intermediate result; and
a second comparator operative to compare the intermediate result with a prescribed value to determine whether or not the intermediate result has a second carry; and
a third adder configured to add the intermediate result to an input second carry of a previous digit and subtract the value equal to the radix of the digits from the intermediate result if the intermediate result has a second carry.

7. The system of claim 6, wherein each digit of each number has two bits.

8. The system of claim 3,
wherein the initial threshold is chosen between the values of 2 and 5; and
wherein the prescribed value is 2.

9. The system of claim 6, wherein the first, second, and third adders are configured to operate on each set of binary digits of the two numbers.

10. A system for adding two numbers, having a plurality of digits, so that the sum has a redundant sign-digit format, the system comprising a plurality of coder blocks, each coder block being a system according to claim 6, said plurality of blocks arranged in series to form a chain, wherein first and second carry inputs are connected to first and second carry outputs of a previous block, wherein each coder block receives one of the digits of the plurality of digits and converts each received digit into redundant sign-digit format.

11. A system for adding a first digit A having bits $a_{1i}$, $a_{0i}$, and a second digit B having bits $b1i$, $b0i$, so that the sum has a redundant sign-digit format, the system comprising:
first adder means for calculating a first result Di having the value $a1i*2+a0i+b1i*2+b0i$;
first comparator means for comparing the first result Di with the initial threshold nt to determine whether or not the first result has a first carry C1out;
second adder means for calculating an intermediate result $D1i$ having the value $Di+C1in-C1out·r$, where r is a value equal to the radix of the digits and C1in is a first input carry from a previous digit and C1out is the carry from the first result;
second comparator means for comparing the intermediate result $D1i$ with a prescribed value to determine whether or not the intermediate result has a second carry C2out; and
third adder means for calculating a final result $D2i$ having a value $D1i+C2in-C2out·r$, where C2in is a second input carry from a previous digit and C2out is a second carry out from the intermediate result.

12. The system of claim 11,
wherein C1out is greater than zero if Di is greater than or equal to the initial threshold; and
wherein C2out is greater than zero if $D1i$ is greater than or equal to the prescribed value.

13. A system for multiplying the sum of a first number A having bits $a1i$, $a0i$ and a second number B having bits $b1i$, $b0i$, by a third number C, the system comprising:
first adder means for calculating a first result Di having the value $a1i*2+a0i+B1i*2+b0i$;
first comparator means for comparing the first result with a initial threshold to determine whether or not the first result has a first carry out;
second adder means for calculating an intermediate result $D1i$ having the value $Di+Cin-C1out·r$, where r is a value equal to the radix of the digits and C1in is a first input carry from a previous digit and C1out is the first carry out from the first result;
second comparator means for comparing the intermediate result to a prescribed value to determine whether or not the intermediate result has a second carry;
third adder means for calculating a final result $D2i$ having a value $D1i+C2in-C2out·r$ where C2in is second input carry from a previous digit and C2out is the second carry out from the intermediate result and $D2i$ is the sum of A and B in redundant sign-digit format; and
multiplier means for multiplying $D2i$ by C to obtain a final result.

14. The system of claim 13,
wherein C1out is greater than zero if Di is greater than or equal to the initial threshold; and
wherein C2out is greater than zero if $D1i$ is greater than or equal to the prescribed value.

15. A system for multiplying the sum of a first number A having bits and a second number B having bits by a third number C, the system comprising:
a first adder configured to add the bits of A and B together to generate a first result;
a first comparator for comparing the first result with an initial threshold to determine whether or not the first result has a first carry;
a second adder configured to add the first result to an input first carry of a previous digit and to subtract a value equal to the radix of the digits from the first result if the first result has a first carry in order to generate an intermediate result;

a second comparator for comparing the intermediate result with a prescribed value to determine whether or not the intermediate result has a carry; and a third adder configured to add the intermediate result to an input second carry of a previous digit and subtract the value equal to the radix of the digits from the intermediate result if the intermediate result has a carry so that the sum of the two numbers has redundant sign-digit format; and a multiplier configured to multiply the redundant sign-digit format of the sum of A and B by the value of C to obtain the final result.

16. The system of claim 15, wherein each digit of each number has two bits.

17. The system of claim 15, wherein the initial threshold is chosen between the values of 2 and 5; and wherein the prescribed value is 2.

18. A method for multiplying the sum of a first number A having binary digits and a second number B having binary digits by a third number C, the method comprising:

determining an initial threshold for the conversion;

adding with a first adder the digits of A and B together to generate a first result;

comparing the first result with the initial threshold to determine whether or not the first result has a first carry;

adding with a second adder the first result to an input first carry of a previous digit and subtracting with the second adder a value equal to the radix of the digits from the first result if the first result has a first carry in order to generate an intermediate result;

comparing the intermediate result with a prescribed value to determine whether or not the intermediate result has a second carry;

adding with the third adder the intermediate result to an input second carry of the previous digit and subtracting with the third adder the value equal to the radix of the digits from the intermediate result if the intermediate result has a second carry so that the sum of A and B has redundant sign-digit format; and multiplying the redundant sign-digit format of the sum of A and B by the value of C with a multiplier in order to generate a final result.

19. The method of claim 18, wherein each digit has two bits.

* * * * *